United States Patent [19]

Yokoyama et al.

[11] Patent Number: 5,776,356
[45] Date of Patent: Jul. 7, 1998

[54] METHOD FOR ETCHING FERROELECTRIC FILM

[75] Inventors: Seiichi Yokoyama; Yasuyuki Itoh, both of Kashiwa; Shigeo Onishi; Jun Kudo, both of Nara; Keizo Sakiyama, Kashihara; Hitoshi Urashima, Tenri, all of Japan

[73] Assignee: Sharp Kabushiki Kaisha, Osaka, Japan

[21] Appl. No.: 388,828

[22] Filed: Feb. 15, 1995

[30] Foreign Application Priority Data

Jul. 27, 1994 [JP] Japan ................................ 6-175363
Oct. 26, 1994 [JP] Japan ................................ 6-262629

[51] Int. Cl.$^6$ ............................................. H01L 21/3065
[52] U.S. Cl. ............................................. 216/76
[58] Field of Search ........................... 156/643.1, 646.1, 156/656.1; 216/76, 57; 437/228

[56] References Cited

U.S. PATENT DOCUMENTS 5,382,320  1/1995  Desu et al. .................... 156/643.1
5,443,688  8/1995  Toure et al. ................... 156/646.1

FOREIGN PATENT DOCUMENTS 6-151383   5/1994  Japan .

OTHER PUBLICATIONS

Glabbeek et al. "Reactive Ion etching of Pt/PbZr$_x$Ti$_{1-x}$O$_3$/Pt integrated ferroelectric capacitors", Ferroelectric Thin Films III Symposium. Mater. Res. Soc., xiii+500pp., pp. 127–132, 1993.

Poor et al. "Plasma Etching of PLT Thin Films and Bulk PLZT Using Fluorine–And Chlorine–Based Gases", Mat. Res. Soc. Symp. Proc., vol. 200, 1990.

Saito et al. "Reactive Ion Etching of Sputtered PbZr$_1$–$x$Ti$_x$O$_3$ Thin Films", Jpn. J. Appl. Phys., vol. 31, L 1260–L 1262, 1992.

Lee et al. "Two–Dimensional Silicon/PLZT Spatial Light Modulators: Design Considerations and Technology", Optical Engineering, vol. 25, No. 2, pp. 250 and 255–260, Feb. 1986.

Vijay et al. "Reactive Ion Etching of Lead Zirconate Titanate (PZT) Thin Film Capacitors", J. Electrochem. Soc., vol. 140, No. 9, Sep. 1993.

Trolier et al. "Etched Piezoelectric Structures", Proc. Sixth IEEE Int. Symp. on Appl. of Ferroelectrics, 1986.

*Primary Examiner*—Thi Dang
*Attorney, Agent, or Firm*—Nixon & Vanderhye P.C.

[57] ABSTRACT

A method for etching a ferroelectric film made of a compound containing lead of the present invention, includes the steps of: forming an insulating film, metal films, and a ferroelectric film on a substrate in this order; forming an etching resistant film on the ferroelectric film, followed by patterning; and etching the ferroelectric film with a mixed gas containing an inert gas and a halogen gas or a halogenated gas as an etching gas, using the patterned etching resistant film as an etching mask.

24 Claims, 8 Drawing Sheets

METHOD FOR ETCHING FERROELECTRIC FILM

BACKGROUND OF THE INVENTION

1. Field of the Invention

The present invention relates to a method for etching a ferroelectric film, and more particularly to a method for etching a ferroelectric film containing lead.

2. Description of the Related Art

In recent years, ferroelectric non-volatile memory devices using as a capacitor a ferroelectric thin film with spontaneous polarization have extensively been developed. Such a ferroelectric thin film is also utilized for a volatile memory capacitor, a light modulator, a piezoelectric element, and a pyroelectric infrared sensor. Examples of a material for the ferroelectric film include oxides such as $PZT(PbZr_xT_{1-x}O_3$, lead titanate zirconate), $PbTiO_3$ (lead titanate), $BaTiO_3$ (barium titanate), and PLZT ($Pb_xLa_{1-x}Zr_yTi_{1-y}O_3$, lanthanum lead titanate zirconate). Among these oxides, PZT has vigorously been studied as the most potential non-volatile memory material.

In a case where a ferroelectric film is utilized for a ferroelectric non-volatile memory device, the ferroelectric film is required to be subjected to microprocessing so as to form highly integrated memories.

Conventionally, various techniques have been used for etching such a ferroelectric film. For example, a ferroelectric film such as a PZT film is etched by the following techniques: wet etching (S. Trolier, et al., Proc. Sixth IEEE Int. Symp. on Appl. of Ferroelectrics, Bethlehem, Pa. (1986) p. 107), ion milling using $C_2F_6$ (S. Lee, et al., Optical Engineering 25 (1986), p. 250), dry etching using $CCl_2F_2$ (Dilip P. et al., J. Electrochem. Soc., Vol. 140, No. 9 (1993) p. 2635), dry etching using $HCl/CF_4$ (M. R. Poor, et al., Mat. Res. Soc. Symp. Proc. Vol. 200 (1992) p. 211), and dry etching using $CCl_4$ (K. Saito, et al., Jpn. Appl. Phys. Vol. 31 (1992) p. L1260).

However, the conventional etching techniques as described above have the following drawbacks. First, wet etching is not suitable for microprocessing because of poor controllability. As for ion milling using an inert gas (e.g., argon), there are problems such as a low rate of etching, contamination of the ferroelectric film caused by re-adhering of the etched material to the surface of the film, and a pattern size shift caused by re-adhering of the etched material to the side walls of the remaining portions of the ferroelectric film after etching. In order to avoid such re-adhering of etched material, the amount of ions which are vertically incident upon a ferroelectric film is decreased to taper the side walls of the remaining portions of the ferroelectric film after etching. In this case, because of the tapered side walls, each line width of memories made of the ferroelectric film cannot be controlled with good precision. As means for overcoming such conventional problems involved in microprocessing, dry etching techniques have been studied. However, dry etching using a fluorine-containing gas or chloride gas also have drawbacks. To be more specific, in a case where PZT or PLZT is used as a material for a ferroelectric film, a lead halide generated by a reaction of PZT or PLZT with etching gases has low vapor pressure; therefore, the etching rate of the ferroelectric film made of PZT or PLZT is low. Furthermore, since the lead halide is non-vaporizing, the lead halide thus generated is likely to be deposited on side walls of the remaining portions of the ferroelectric film after etching, resulting in a pattern size shift.

FIG. 12 is a diagram illustrating problems involved in the prior art. In this figure, the reference numeral 21 denotes a silicon substrate, 22 an NSG film, 23 Ti film, 24 TiN film, 25 a Pt/Ti film, 26 a Pt film, 27 a PZT film, and 28 a deposit. As is understood from FIG. 12, for example, in a case where the PZT film is etched by ion milling with argon gas or dry etching with $SF_6$ alone, the non-volatile deposit 28 is formed on the side walls of the remaining portions of the PZT film 27 after etching to cause a pattern size shift. This translates into difficulty in performing the desired microprocessing of the ferroelectric film.

As described above, the conventional microprocessing techniques of the ferroelectric film respectively have problems.

SUMMARY OF THE INVENTION

A method of the present invention for etching a ferroelectric film made of a compound containing lead, includes the steps of:

forming an insulating film, metal films, and a ferroelectric film on a substrate in this order;

forming an etching resistant film on the ferroelectric film, followed by patterning; and etching the ferroelectric film with a mixed gas containing an inert gas and a halogen gas or a halogenated gas as an etching gas, using the patterned etching resistant film as an etching mask.

In one embodiment of the present invention, a ratio of a flow rate of the halogen gas or the halogen compound gas with respect to a total flow rate of the mixed gas is 50% or less.

In another embodiment of the present invention, a substrate temperature in the course of the etching is in the range of 100° C. to 400° C.

In another embodiment of the present invention, the halogen gas or the halogen compound gas is chlorine gas or a chloride gas.

In another embodiment of the present invention, the etching resistant film is a silicon oxide film.

In another embodiment of the present invention, the mixed gas further contains a hydrocarbon gas.

In another embodiment of the present invention, the hydrocarbon gas is $CH_4$.

Alternatively, a method of the present invention for etching a ferroelectric film made of a compound containing lead, includes the steps of:

forming an insulating film, metal films, and a ferroelectric film on a substrate in this order;

forming an etching resistant film on the ferroelectric film, followed by patterning;

etching the ferroelectric film with a mixed gas containing an inert gas, a halogen type first gas, and a halogen type second gas containing carbon and hydrogen as an etching gas, using the patterned etching resistant film as an etching mask; and removing side-wall deposited films formed on side walls of the etched ferroelectric film by wet treatment with an aqueous solution.

In one embodiment of the present invention, a substrate temperature in the course of the etching is in a range of 50° C. to 150° C.

In another embodiment of the present invention, the etching resistant film is a resist.

In another embodiment of the present invention, a ratio of a flow rate of the inert gas with respect to a total flow rate of the mixed gas is less than 50%.

In another embodiment of the present invention, a vacuum degree in the course of etching using the mixed gas is in the range of 1 mTorr to 10 mTorr.

In another embodiment of the present invention, the inert gas is Ar gas, the first gas of halogen type is $CF_4$ gas or $SF_6$ gas, and the second gas of halogen type is $CHF_3$ gas.

In another embodiment of the present invention, a ratio of a flow rate of the second gas of halogen type with respect to a total flow rate of the first and second gas of halogen type is less than 70%.

In another embodiment of the present invention, the aqueous solution used for the wet treatment is $H_2O$.

In another embodiment of the present invention, a temperature of the aqueous solution used for the wet treatment is in the range of 25° C. to 100° C.

Thus, the invention described herein makes possible at least one of the advantages of (1) providing microprocessing of a ferroelectric film with high precision without causing a pattern size shift; (2) providing microprocessing of a ferroelectric film with high precision at a high etching rate; (3) providing microprocessing of a ferroelectric film with high precision in a simplified process; and (4) microprocessing of a ferroelectric film with high precision using a conventional resist film.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the drawings.

Figure 2:
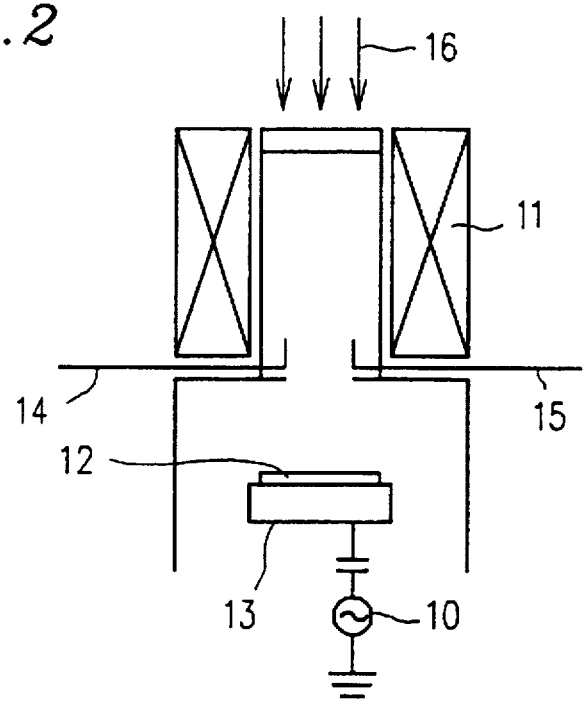
FIG. 2 is a view schematically showing an Electron Cyclotron Resonance (ECR) plasma etching apparatus used for Examples 1 to 3 according to the present invention.

The method for etching a ferroelectric film of Examples 1 to 3 according to the present invention can be implemented by using a device for generating high-density plasma (e.g., helicon wave plasma (HWP), inductive coupling plasma (ICP)) at a low pressure, such as an ECR plasma etching apparatus as shown in FIG. 2. Referring to FIG. 2, the ECR plasma etching apparatus includes a high frequency power source 10, solenoid coils 11, an electrode 13, gas inlets 14 and 15. A wafer 12 is mounted on the electrode 13. ECR plasma is generated by a microwave 16 and a magnetic field caused by the solenoid coils 11.

EXAMPLE 1

A method for etching a ferroelectric film of the present example will be described with reference to FIGS. 1A through 1D.

Figure 1A:
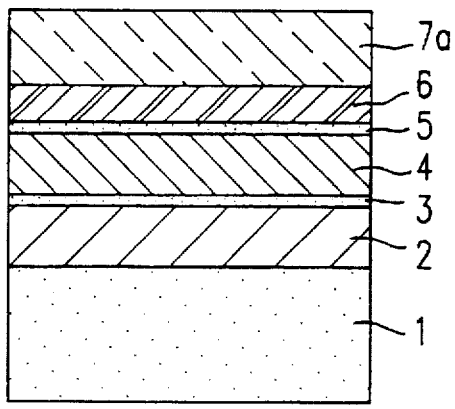
FIGS. 1A through 1D are respectively cross-sectional views illustrating a method for etching a ferroelectric film of Example 1 according to the present invention.

Referring to FIG. 1A, the first step of the method for etching a ferroelectric film of the present example will be described below.

An NSG film 2 having a thickness of about 300 nm as an insulating film is formed on a silicon-substrate 1 by chemical vapor deposition (CVD). Then, a Ti film 3 having a thickness of about 20 nm is formed on the NSG film 2 by sputtering at an argon flow rate of 85 SCCM and an RF power of 3 kW under a pressure of 2.5 mTorr. Thereafter, a TiN film 4 having a thickness of about 200 nm as a barrier layer is formed on the Ti film 3 by sputtering at an argon flow rate of 58 SCCM, a nitrogen flow rate of 76 SCCM, and an RF power of 5 kW under a pressure of 4 mTorr. The Ti film 3 enhances the adhesion between the NSG film 2 and the TiN film 4. Then, a Ti film 5 having a thickness of about 20 nm is formed on the TiN film 4 by sputtering at an argon flow rate of 85 SCCM and an RF power of 3 kW under a pressure of 2.5 mTorr. A Pt film 6 having a thickness of about 100 nm as a lower electrode is formed on the Ti film 5 by sputtering at an argon flow rate of 120 SCCM and an RF power of 2 kW under a pressure of 4 mTorr. The Ti film 5 enhances the adhesion between the TiN film 4 and the Pt film 6. A ferroelectric PZT film 7a is formed on the Pt film 6 by a sol-gel method. The PZT film 7a is formed by coating a sol-gel solution of a precursor of PZT onto the Pt film 6 by using a spin coater and pre-baking the sol-gel solution coated on the Pt film 6 at 400° C. for one hour. PLZT, PNZT ($Pb_xNb_{1-x}Zr_yTi_{1-y}O_3$, niobium lead titanate zirconate), and films made of Pb containing compounds such as $PbTiO_3$ or $PbZrO_3$ can be used in place of PZT.

Figure 1C:
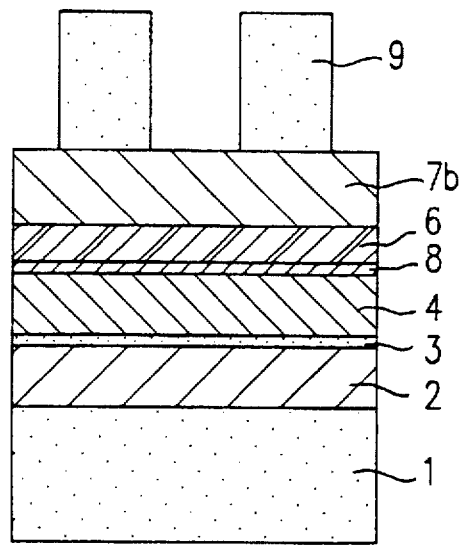
Figure 1B:
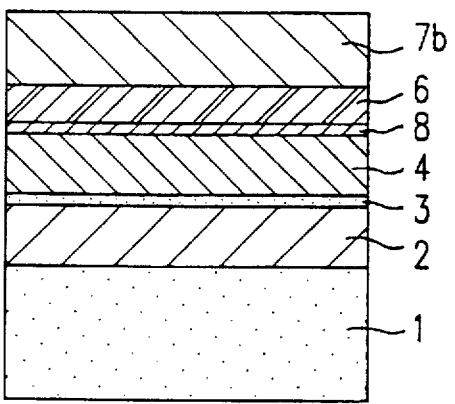

Referring to FIG. 1B, the second step of the method for etching a ferroelectric film of the present example will be described below.

The PZT film 7a is baked by rapid thermal annealing (RTA) at 600° C. for 30 seconds to obtain a PZT film 7b. The PZT film 7b thus obtained has a thickness of about 250 nm. At this time, Pt and Ti forms a eutectic between the Pt film 6 and the TiN film 4 to provide a Pt/Ti film 8. Furthermore, the morphorogy of the Pt film 6 as a lower electrode becomes an aggregation of grains.

Referring to FIG. 1C, the third step of the method for etching a ferroelectric film of the present example will be described below.

A spin on glass (SOG) film 9 having a thickness of 1 μm as an etching resistant film is formed on the PZT film 7b by using a spin coater, followed by baking. It is noted that for using the SOG film 9 as an etching mask, the reaction between the SOG film 9 and the PZT film 7b should be suppressed by keeping the temperature of the silicon substrate 1 preferably in the range of 100° C. to 400° C. A TEM analysis reveals the following: In a case where the SOG film 9 is used as an etching mask, reaction does not occur at the interface between the SOG film 9 and the PZT film 7b even though a temperature for etching is raised to about 350° C., and in a case where an NSG film is used as an etching mask, reaction does not occur at the interface between the SOG film 9 and the PZT film 7b even though a temperature for etching is raised to about 400° C. Other examples of the etching resistant film include an oxide mask such as NSG film.

Next, the SOG film 9 is patterned to squares with a size of 0.8 μm to 2.5 μm by photolithography using a resist to obtain an etching mask. The SOG film 9 is etched by using a microwave plasma etching device at a $CF_4$ flow rate of 50 SCCM, a microwave power of 200 mA, and an RF power of 40 W under a pressure of 5 mTorr. Thereafter, the resist is removed by ashing.

Figure 1D:
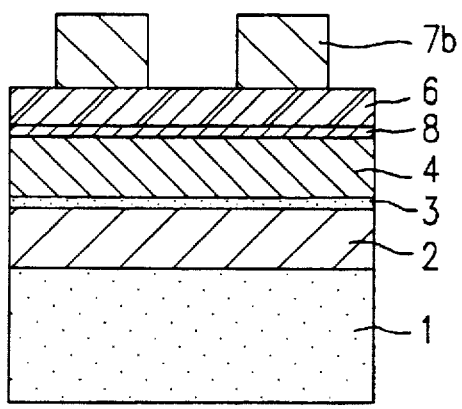

Referring to FIG. 1D, the fourth step of the method for etching a ferroelectric film of the present example will be described below.

The PZT film 7b is etched with the ECR plasma etching apparatus as shown in FIG. 2, by introducing a mixture of Ar gas and $Cl_2$ gas as an etching gas at a flow rate of 63 SCCM and 27 SCCM, respectively, under the conditions of a pressure of 1.4 mTorr, a microwave power of 1000 W, an RF power of 100 W, and a substrate temperature of 300° C. Finally, the SOG film 9 remaining as an etching mask is removed by etching using a microwave plasma etching apparatus at a $CF_4$ flow rate of 50 SCCM, a microwave power of 200 mA, and an RF power of 40 W under a pressure of 5 mTorr.

The substrate temperature at a time of etching the PZT film 7b is preferably in the range of 100° C. to 400° C. In a case where the substrate temperature is less than 100° C., a halide of lead is not volatilized, so that the PZT film 7b is not sufficiently etched. In a case where the substrate temperature exceeds 400° C., undesired reaction may be effected at the interface between the etching mask 9 formed of SOG and the PZT film 7b. Furthermore, the ferroelectric characteristics may be changed.

In a case where the substrate temperature is 150° C. or less, a resist can be used as an etching mask. However, in this case, the resist cannot be prevented from being etched. This sometimes leads to a slight pattern size shift.

In order to obtain stable plasma by the ECR plasma etching apparatus, the vacuum degree at a time of etching the PZT film 7b is preferably in the range of 1 to 10 mTorr, more preferably in the range of 1 to 3 mTorr.

Figure 3:
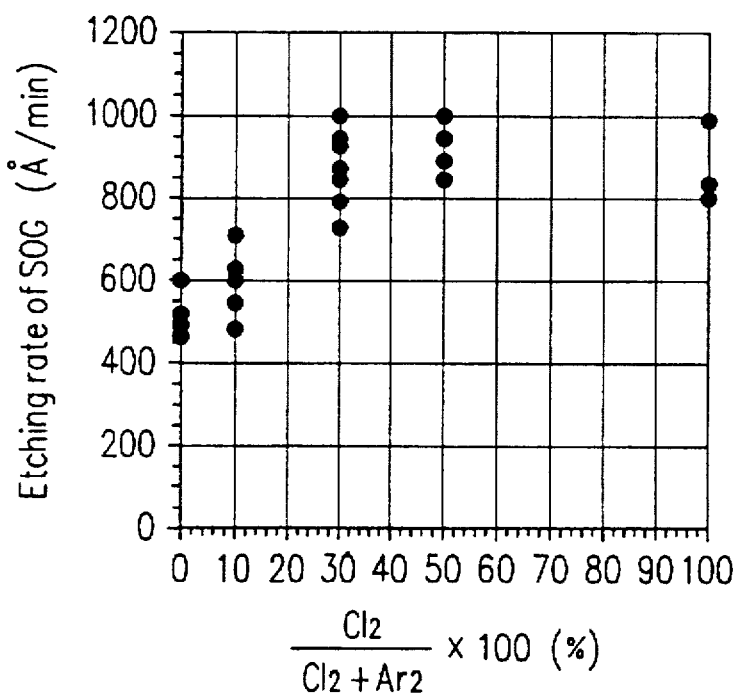
FIG. 3 is a graph showing the relationship between the adding amount of chlorine gas and the etching rate of an etching mask.

As shown in FIG. 3, under the condition that the ratio of a $Cl_2$ gas flow rate to a total flow rate of Ar gas and $Cl_2$ gas is in the range of 0 to 50%, an etching rate becomes greater with the increase in adding amount of $Cl_2$ gas. However, once the ratio of a $Cl_2$ gas flow rate exceeds 50%, the etching rate is held nearly constant irrespective of the ratio of a $Cl_2$ gas flow rate. It is hence preferred that the ratio of a $Cl_2$ gas flow rate is increased in a range of 50% or less so as to increase the etching rate. Considering the selectivity of etching, the ratio of a halogen ($Cl_2$) gas flow rate to the total flow rate of the etching gas during the abovementioned etching is preferably in the range of 1% to 50%, more preferably in the range of 20% to 40%. In the present example, the ratio is prescribed to be 30%. In a case where the flow rate ratio exceeds 50%, the selectivity is not sufficient. As a halogen gas, $Cl_2$ gas or a chloride gas is preferably used, since these gases are volatilized more readily, compared with other halogen gases. In the present example, $Cl_2$ gas is used. Alternatively, a chloride gas such as $CCl_4$ and $CHCl_3$ can be used.

As described above, the ferroelectric film such as a PZT film is etched with a mixed gas containing an inert gas and a halogen gas or a halogenated gas. The binding force between lead and oxygen contained in the ferroelectric film is weakened by sputtering with the inert gas, whereby the halogenation of lead with the halogen gas or the halogenated gas is promoted. Furthermore, the ferroelectric film is etched by setting the atmosphere of etching to be a high temperature to allow the halogenated lead to volatilize.

Figure 4:
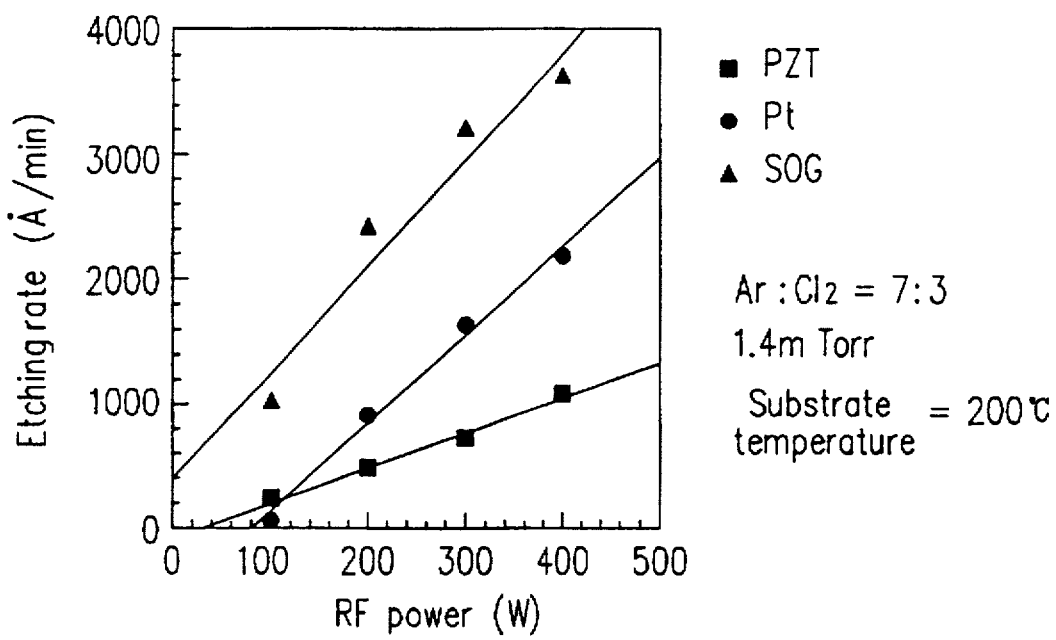
FIG. 4 is a graph showing the relationship between the RF power and the etching rate.
Figure 5:
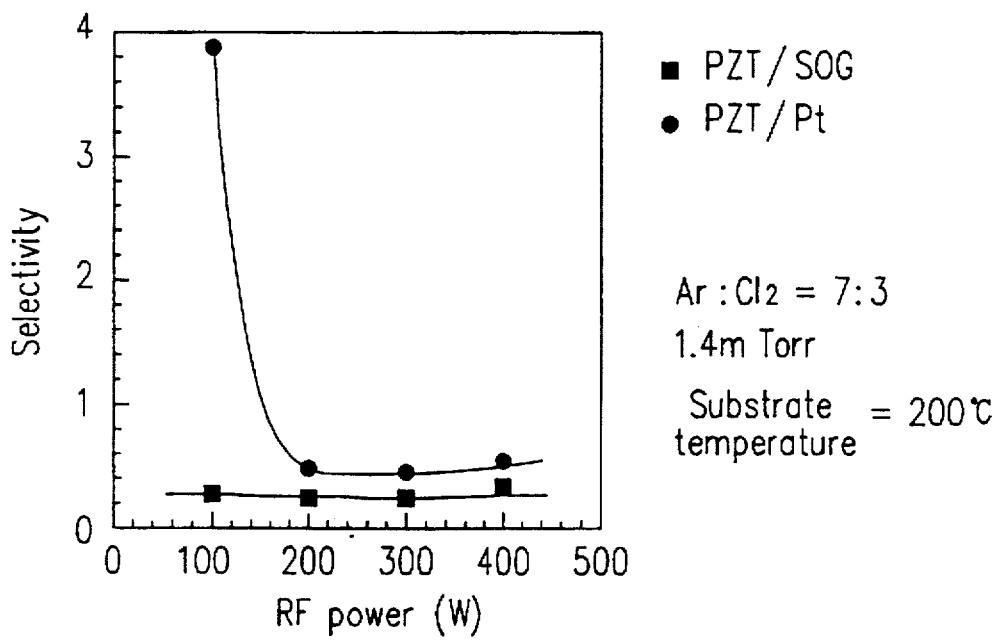
FIG. 5 is a graph showing the relationship between the RF power and the selectivity.

As is understood from FIG. 4, when an RF power is increased, the etching rate of the PZT film, the Pt film, and the SOG film becomes higher; however, the selectivity of etching therebetween is generally decreased. Furthermore, referring to FIG. 5, it is understood that the selectivity of etching between PZT and Pt is markedly great when the RF power is low. Thus, the RF power during etching is preferably in the range of 100 to 200 W, and more preferably in the range of 100 to 150 W, provided that the selectivity is considered. This is because it is critical that the selectivity of etching between PZT and Pt is more than 1 for obtaining sufficient uniformity on the surface of the Pt film 6 after etching.

According to the conventional dry etching using fluorine gas, in a case where the PZT film has a thickness of 3000 Å and has a taper angle of 45°, the pattern size shift is 0.3 μm. In the present example, the pattern size shift can be suppressed to 0.05 μm or less.

According to the conventional ion milling using Ar, the etching rate is 300 Å/min. under the conditions of a pressure of 1.4 mTorr, a microwave power of 1000 W, an RF power of 200 W, and a substrate temperature in the range of 200° C. to 300° C. In the present example, the etching rate is 520 Å/min. when using a mixed gas containing Ar and $Cl_2$ at a flow rate of 63 SCCM and 27 SCCM, respectively.

As described above, in the present example, microprocessing of a ferroelectric film made of a compound containing lead is achieved with high precision at a high etching rate under the condition that a pattern size shift is not caused at all or a pattern size shift is suppressed to a minimum degree.

EXAMPLE 2

The present example shows the case where a pattern size shift is not caused even though a resist is used.

Hereinafter, a method for etching a ferroelectric film of the present example will be described with reference to FIGS. 6A through 6E.

Figure 6A:
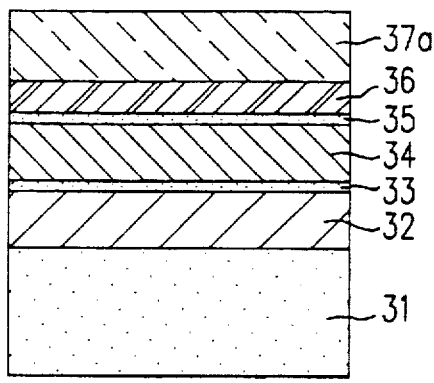
FIGS. 6A through 6E are respectively cross-sectional views showing a method for etching the ferroelectric film of Example 2 according to the present invention.

Referring to FIG. 6A, the first step of the method for etching a ferroelectric film of the present example will be described below.

An NSG film 32 having a thickness of about 300 nm as an insulating layer is formed on a silicon substrate 31 by chemical vapor deposition (CVD). Then, a Ti film 33 having a thickness of about 20 nm is formed on the NSG film 32 by sputtering at an argon flow rate of 85 SCCM and an RF of 3 kW under a pressure of 2.5 mTorr. Thereafter, a TiN film 34 having a thickness of about 200 nm as a barrier layer is formed on the Ti film 33 by sputtering at an argon flow rate of 58 SCCM, a nitrogen flow rate of 76 SCCM, and an RF of 5 kW under a pressure of 4 mTorr. The Ti film 33 enhances the adhesion between the NSG film 32 and the TiN film 34. Then, a Ti film 35 having a thickness of about 20 nm is formed on the TiN film 34 by sputtering at an argon flow rate of 85 SCCM and an RF power of 3 kW under a pressure of 2.5 mTorr. A Pt film 36 having a thickness of about 100 nm as a lower electrode is formed on the Ti film 35 by sputtering at an argon flow rate of 120 SCCM and an RF power of 2 kW under a pressure of 4 mTorr. The Ti film 35 enhances the adhesion between the TiN film 34 and the Pt film 36. A ferroelectric PZT film 37a is formed on the Pt film 36 by a sol-gel method. The PZT film 37a is formed by coating a sol-gel solution of a precursor of PZT onto the Pt film 36 by using a spin coater and pre-baking the sol-gel solution coated on the Pt film 36 at 400° C. for one hour.

Figure 6D:
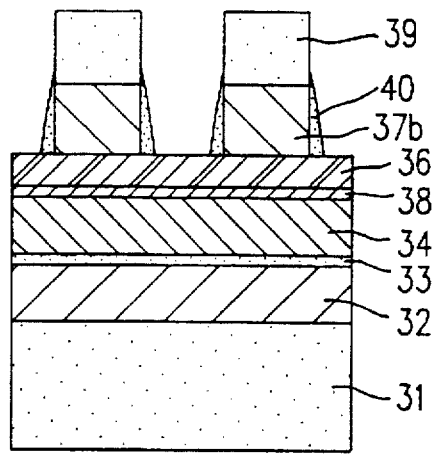
Figure 6B:
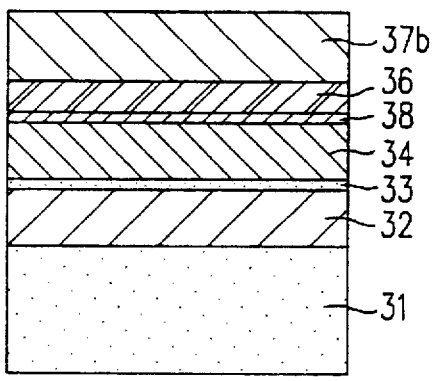

Referring to FIG. 6B, the second step of the method for etching a ferroelectric film of the present example will be described below.

The PZT film 37a is baked by rapid thermal annealing (RTA) at 660° C. for 30 seconds to obtain a PZT film 37b. The PZT film 37b thus obtained has a thickness of about 250 nm. At this time, Pt and Ti forms a eutectic between the Pt film 36 and the TiN film 34 to provide a Pt/Ti film 38.

Figure 6E:
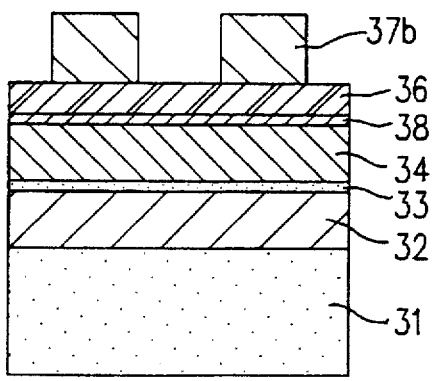
Figure 6C:
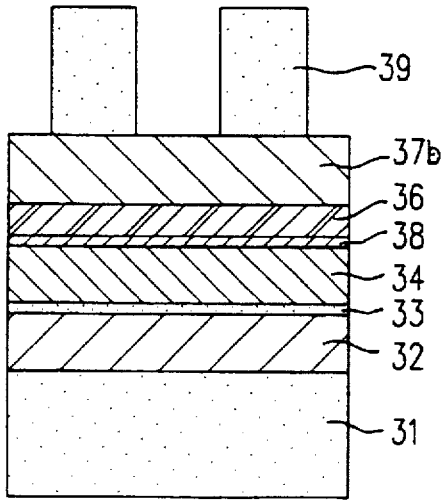

Referring to FIG. 6C, the third step of a method for etching a ferroelectric film of the present example will be described below.

A resist film 39 having a thickness of 2 μm is formed on the PZT film 37b and patterned to squares with a size of 0.8 to 2.5 μm by photolithography to obtain an etching mask.

Referring to FIG. 6D, the fourth step of the method for etching a ferroelectric film of the present example will be described below.

The PZT film 37b is etched with the ECR plasma etching apparatus as shown in FIG. 2, by introducing as an etching gas a mixed gas containing Ar, $CF_4$ (first gas of halogen type), and $CHF_3$ (second gas of halogen type) with a ratio of 1:1:2 or a mixed gas containing Ar, $SF_6$ (first gas of halogen type), and $CHF_3$ (second gas of halogen type) with a ratio of 1:1:2 under the conditions of a pressure of 1.4 mTorr, a microwave power of 1000 W, an RF power of 100 W, and a substrate temperature of 50° C. As a result of the etching, side wall deposited films 40 are formed on side walls of the PZT film 37b.

Examples of the first gas of halogen type include $CF_4$, $SF_6$, $C_3F_8$. Examples of the second gas of halogen type include $CHF_3$, $CH_2F_2$.

In order to obtain stable plasma by the ECR plasma etching apparatus, the vacuum degree at a time of etching the PZT film 37b is preferably in the range of 1 to 10 mTorr. For etching the PZT film 37b with high anisotropy, a higher vacuum degree is preferred. For this reason, in the present example, the vacuum degree is prescribed to be 1.4 mTorr.

The ratio of a flow rate of an inert gas with respect to the total flow rate of the etching gas is preferably in the range of 1% to 50%, more preferably in the range of 25% to 35%. In a case where the ratio of the flow rate of the inert gas exceeds 50%, the PZT film 37b is not appropriately etched because of insufficient selectivity of etching between PZT and the resist. The ratio of a flow rate of the second gas of halogen type with respect to the total flow rate of the first and second gas of halogen type is preferably less than 70%, more preferably less than 50%. Accordingly, by prescribing the ratio of the flow rate of the inert gas with respect to the total flow rate of the etching gas and the ratio of the flow rate of the second gas of halogen type with respect to the first and second gas of halogen type, respectively to a predetermined ratio, the selectivity of etching between PZT and the resist can be remarkably enhanced to suppress a pattern size shift. For example, in a case where Ar alone is used as the etching gas, the selectivity of etching between PZT and the resist is 0.5; in a case where a mixed gas containing Ar and $CF_4$ with a ratio of 1:1 is used as the etching gas, the selectivity of etching between PZT and the resist is 2.4; and in a case where a mixed gas containing Ar, $CF_4$, and $CHF_3$ with a ratio of 1:1:2 is used as the etching gas, the selectivity of etching between PZT and the resist is 6.6.

Referring to FIG. 6E, the final step of the method for etching a ferroelectric film of the present example will be described below.

The side wall deposited films 40 are removed by wet treatment with hot water and then, the resist film 39 is removed by ashing.

In the above-mentioned wet treatment, it takes 10 minutes or more to remove the side deposited films 40 with hot water at 25° C. and 5 minutes or more with hot water at 100° C. The use of hot water in the wet treatment lowers cost, compared with the case of using another treatment solution. Furthermore, damage to the ferroelectric film caused by treatment solutions can be avoided.

As described above, the ferroelectric film such as a PZT film is etched with a mixed gas containing an inert gas, a halogen type first gas, and a halogen type second gas. The binding force between lead and oxygen contained in the ferroelectric film is weakened by sputtering with the inert gas, whereby the halogenation of lead with the halogen type first gas and the halogen type second gas is promoted. The halogenated lead adhering to the side walls can be removed with hot water. Furthermore, the selectivity between the resist and the ferroelectric film is enhanced to suppress a size pattern shift by using a mixed gas containing the halogen type first gas and the halogen type second gas as a halogen gas.

As is understood from the above description, in the present example, the PZT film can be etched under the condition of a low substrate temperature; therefore, the use of a conventional resist film is made possible. In addition, since the resist film can be removed by ashing, the etching step is simplified.

Furthermore, in the present example, since the side wall deposited films are formed on the side walls of the ferroelectric film to be etched, re-adhering of etched material to the ferroelectric film can be avoided. Consequently, microprocessing of the ferroelectric film can be conducted with high precision without causing a pattern size shift.

According to the conventional ion milling with Ar, the etching rate is 300 Å/min. under the conditions of a pressure of 1.4 mTorr, a microwave power of 1000 W, an RF power of 200 W, and a substrate temperature in the range of 200° C. to 300° C. According to the present example, in a case of using a mixed gas containing Ar, $CF_4$, and $CHF_3$ with a ratio of 1:1:2, the etching rate is increased to 550 Å/min. In a case of using a mixed gas containing Ar, $SF_6$, and $CHF_3$ with a ratio of 1:1:2, the etching rate is increased to 900 to 1000 Å/min. Thus, the etching rate can be increased by using a specific gas.

In the present example, microprocessing of a ferroelectric film made of a compound containing lead can be conducted with high precision at a high etching rate without causing a pattern size shift.

EXAMPLE 3

The present example shows the case where an etching gas contains hydrocarbon gas.

A method for etching a ferroelectric film of the present example will be described with reference to FIGS. 7A through 7E.

Figure 7A:
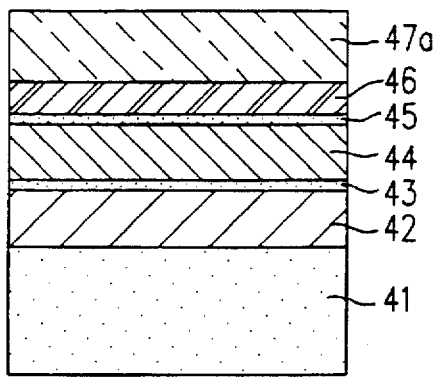
FIGS. 7A through 7E are respectively cross-sectional views showing a method for etching the ferroelectric film of Example 3 according to the present invention.

Referring to FIG. 7A, the first step of the method for etching a ferroelectric film of the present example will be described below.

An NSG film 42 having a thickness of about 300 nm as an insulating film is formed on a silicon substrate 41 by chemical vapor deposition (CVD). Then, a Ti film 43 having a thickness of about 20 nm is formed on the NSG film 42 by sputtering at an argon flow rate of 85 SCCM and an RF power of 3 kW under a pressure of 2.5 mTorr. Thereafter, a TiN film 44 having a thickness of about 200 nm as a barrier layer is formed on the Ti film 43 by sputtering at an argon flow rate of 58 SCCM, a nitrogen flow rate of 76 SCCM, and an RF power of 5 kW under a pressure of 4 mTorr. The Ti film 43 enhances the adhesion between the NSG film 42 and the TiN film 44. Then, a Ti film 45 having a thickness of about 20 nm is formed on the TiN film 44 by sputtering at an argon flow rate of 85 SCCM and an RF power of 3 kW under a pressure of 2.5 mTorr. A Pt film 46 having a thickness of about 100 nm as a lower electrode is formed on the Ti film 45 by sputtering at an argon flow rate of 120 SCCM and an RF power of 2 kW under a pressure of 4 mTorr. The Ti film 45 enhances the adhesion between the TiN film 44 and the Pt film 46. A ferroelectric PZT film 47a is formed on the Pt film 46 by a sol-gel method. The PZT film 47a is formed by coating a sol-gel solution of a precursor of PZT onto the Pt film 46 by using a spin coater and pre-baking the sol-gel solution coated on the Pt film 46 at 400° C. for one hour.

Figure 7B:
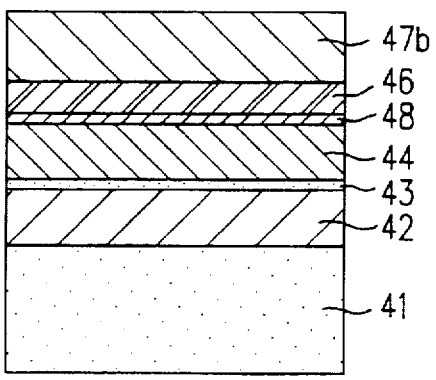

Referring to FIG. 7B, the second step of the method for etching a ferroelectric film of the present example will be described below.

The PZT film 47a is baked by rapid thermal annealing (RTA) at 600° C. for 30 seconds to obtain a PZT film 47b. The PZT film 47b thus obtained has a thickness of about 270 nm. At this time, Pt and Ti forms a eutectic between the Pt film 46 and the TiN film 44 to provide a Pt/Ti film 48.

Figure 7C:
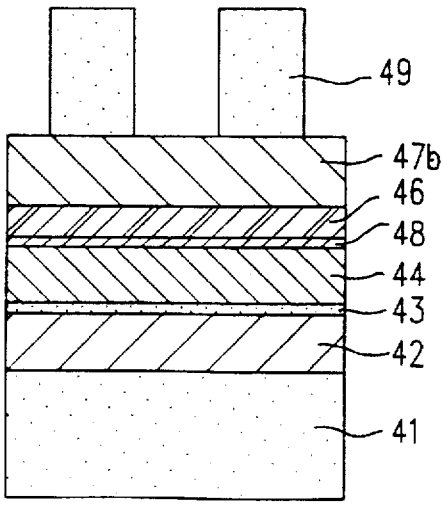

Referring to FIG. 7C, the third step of the method for etching a ferroelectric film of the present example will be described below.

A resist film 49 having a thickness of 2 μm is formed on the PZT film 47b and patterned to squares with a size of 0.8 to 2.5 μm by photolithography to obtain an etching mask.

Figure 7D:
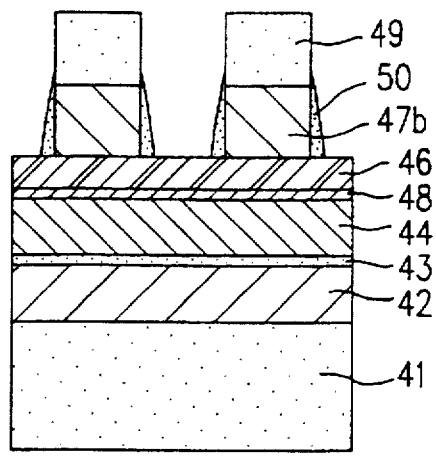

Referring to FIG. 7D, the fourth step of the method for etching a ferroelectric film of the present example will be described below.

The PZT film 47b is etched with the ECR plasma etching apparatus as shown in FIG. 2, by introducing a mixture of Ar gas, $Cl_2$ gas and $CH_4$ gas as an etching gas at a flow rate of 59.5 SCCM, 25.5 SCCM and 5 SCCM, respectively, under the conditions of a pressure of 1.4 mTorr, a microwave power of 1000 W, an RF power of 100 W, and a current of solenoid coils of 20 A. As a result of the etching, side wall deposited films 50 are formed on side walls of the PZT film 47b.

It is prefered that the substrate temperature at a time of etching the PZT film 47b is 150° C. or lower. In the case where the substrate temperature exceeds 150° C., the resist is softened and may be deformed, so that as a result, microprocessing of the ferroelectric film with high precision is difficult to conduct.

In order to obtain stable plasma by the ECR plasma etching apparatus, the degree of vacuum at a time of etching the PZT film 47b is preferably in the range of 0.5 to 10 mTorr, more preferably in the range of 1 to 3 mTorr.

In order to keep the degree of vacuum in a stable state, the total flow rate of etching gas at a time of etching the PZT film 47b is preferably in the range of 40 to 90 SCCM.

Figure 8:
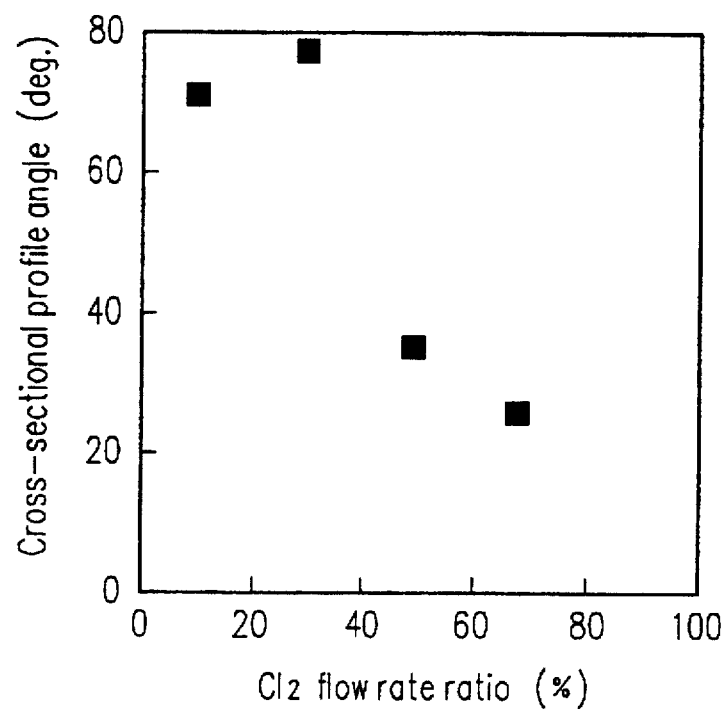
FIG. 8 is a graph showing the relationship between the ratio of the flow rate of $Cl_2$ gas to the total flow rate of etching gas and the cross-sectional profile angle (pattern size shift).
Figure 9:
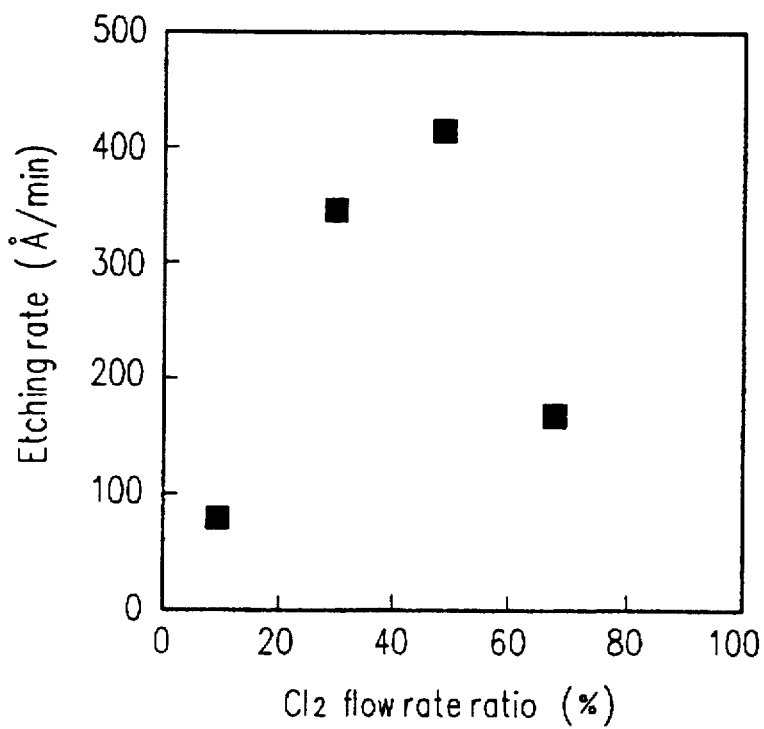
FIG. 9 is a graph showing the relationship between the ratio of the flow rate of $Cl_2$ gas to the total flow rate of etching gas and the etching rate.

FIG. 8 shows the relationship between the ratio of the flow rate of $Cl_2$ gas to the total flow rate of etching gas and a cross-sectional profile angle (a pattern size shift). Here, the cross-sectional profile angle refers to a bottom angle of the cross-section of the ferroelectric film. As the cross-sectional profile angle becomes smaller (i.e., acute angle), the pattern size shift becomes larger. As is apparent from FIG. 8, as the flow rate ratio becomes large, the pattern size shift becomes large. FIG. 9 is a graph showing the relationship between the ratio of the flow rate of $Cl_2$ gas to the total flow rate of etching gas and an etching rate. As is apparent from FIG. 9, in the case where the $Cl_2$ flow rate ratio is 50% or less, the etching rate is decreased as the $Cl_2$ flow rate ratio is smaller. Thus, the ratio of the flow rate of $Cl_2$ gas to the total flow rate of etching gas during the etching is preferably in the range of 10 to 50%.

Figure 10:
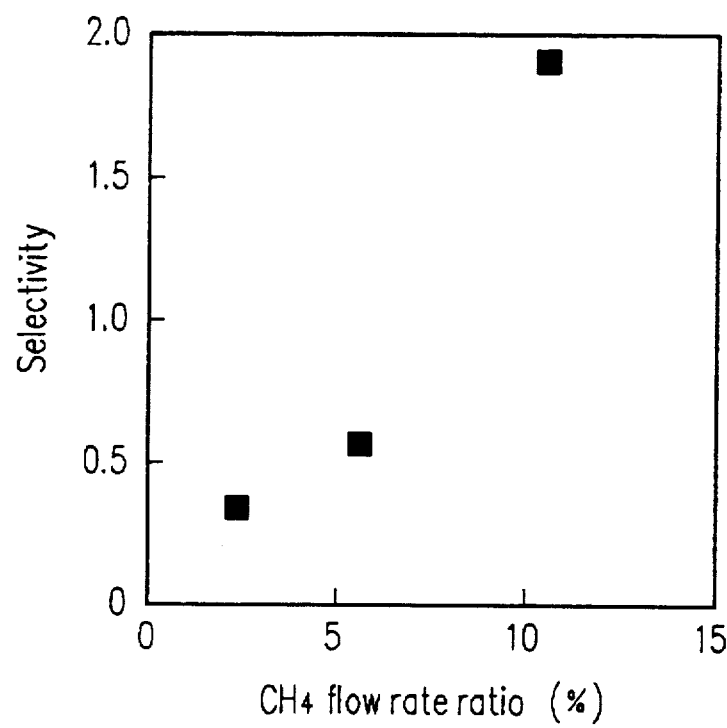
FIG. 10 is a graph showing the relationship between the ratio of the flow rate of $CH_4$ gas to the total flow rate of etching gas and the selectivity.
Figure 11:
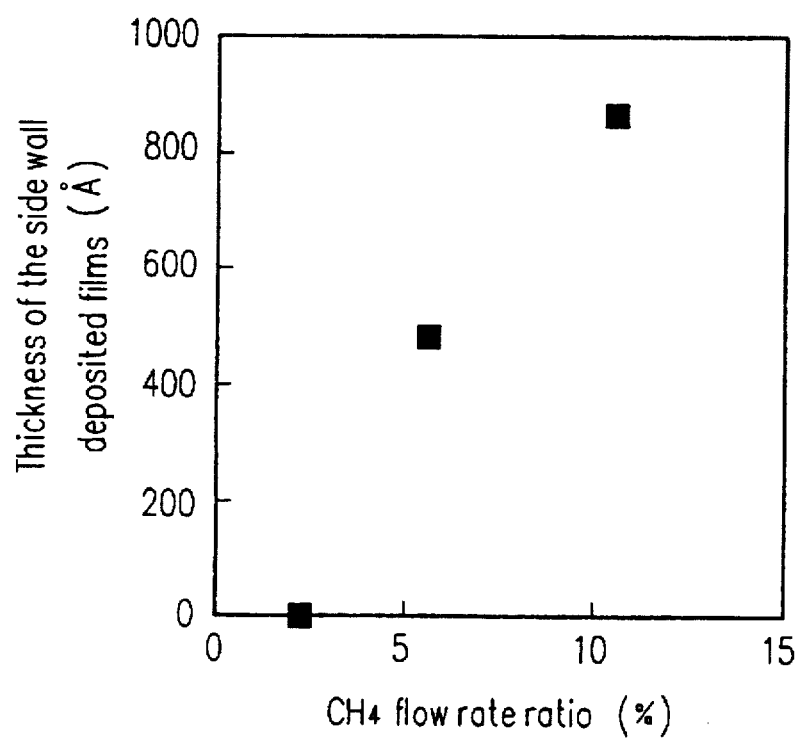
FIG. 11 is a graph showing the relationship between the ratio of the flow rate of $CH_4$ gas to the total flow rate of etching gas and the thickness of the side wall deposited films.

FIG. 10 is a graph showing the relationship between the ratio of the flow rate of $CH_4$ gas to the total flow rate of etching gas and the selectivity. FIG. 11 is a graph showing the relationship between the ratio of the flow rate of $CH_4$ gas to the total flow rate of etching gas and the thickness of the side wall deposited films. As is apparent from FIG. 10, in the case where the $CH_4$ flow rate ratio exceeds 10%, the selectivity is remarkably enhanced. However, as is apparent from FIG. 11, in the case where the $CH_4$ flow rate ratio exceeds 10%, the thickness of the side wall deposited films is increased; as a result, the pattern size shift becomes large. Thus, considering the balance between the pattern size shift and the selectivity, the ratio of the flow rate of $CH_4$ gas to the total flow rate of etching gas at a time of etching the PZT film 47b is preferably in the range of 2 to 10%.

Figure 7E:
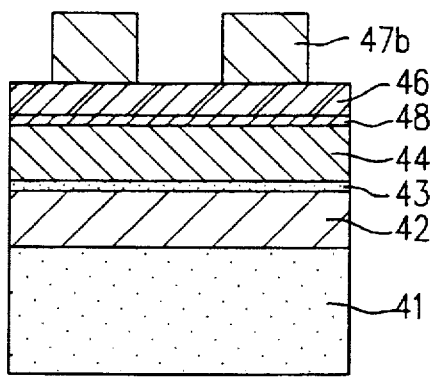

Referring to FIG. 7E, the final step of the method for etching a ferroelectric film of the present example will be described below.

The side wall deposited films 50 are removed by wet treatment with hot water and then, the resist film 49 is removed by ashing. The treatment time was twenty minutes.

Figure 12:
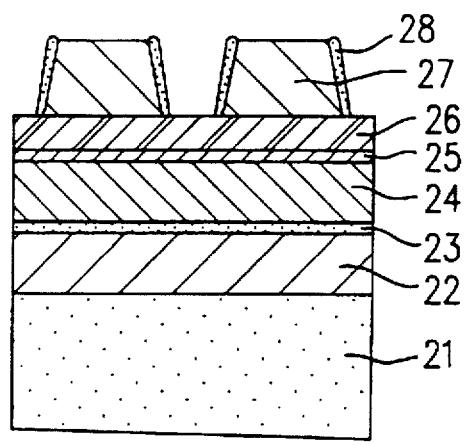
FIG. 12 is a view illustrating problems involved in a conventional etching method.

As is apparent from the schematic comparison between FIGS. 7D and 12, in the present example, the cross-sectional profile after etching is larger and the pattern size shift is smaller, compared with the conventional example. Thus, according to the present example, microprocessing of the PZT film with a small pattern size shift is made possible.

Furthermore, according to the etching method using the ECR plasma etching apparatus, an etching rate of 450 to 500 Å/min. can be achieved. An etching rate obtained by using RIE is 300 Å/min or less. According to the present example, the PZT film can be etched at an etching rate 1.5 times or higher than the case where the RIE is used.

As described above, according to the present example, by introducing a hydrocarbon gas such as $CH_4$ into the etching gas, the PZT film can be etched while the resist side walls are prevented from being etched, whereby microprocessing of the ferroelectric film with a small pattern size shift is made possible.

According to the present invention, the microprocessing of the ferroelectric film with high precision at a high etching rate is made possible by using a specific etching gas and the ECR plasma etching apparatus. Furthermore, the side wall deposited films caused by the etching of the present invention can be easily removed with pure water, so that the etching method of the present invention has advantages in terms of cost, simplification of production, and environmental problems.

The etching method of the present invention can be generally applied to ferroelectric films containing lead such as PLZT films and PNZT films, in addition to PZT films.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for etching a ferroelectric film made of a compound containing lead, comprising the steps of:

forming an insulating film, metal films, and a ferroelectric film on a substrate in this order;

forming an etching resistant film on the ferroelectric film, followed by patterning; and etching the ferroelectric film with a mixed gas containing an inert gas and a halogen gas or a halogenated gas as an etching gas, using the patterned etching resistant film as an etching mask, wherein the halogen gas or the halogenated gas is chlorine gas or a chloride gas, and wherein a ratio of a flow rate of the halogen gas or the halogenated gas with respect to a total flow rate of the mixed gas is 50% or less.

2. A method for etching a ferroelectric film according to claim 1, wherein a substrate temperature in the course of the etching is in the range of 100° C. to 400° C.

3. A method for etching a ferroelectric film according to claim 2, wherein the etching resistant film is a silicon oxide film.

4. A method for etching a ferroelectric film according to claim 1, wherein the mixed gas further contains a hydrocarbon gas, and wherein a ratio of the flow rate of the hydrocarbon gas with respect to a total flow rate of the mixed gas is in the range of 2 to 10%.

5. A method for etching a ferroelectric film according to claim 4, wherein the hydrocarbon gas is $CH_4$.

6. A method for etching a ferroelectric film according to claim 1, wherein a ratio of a flow rate of the halogen gas or the halogenated gas with respect to a total flow rate of the mixed gas is 30 to 50%.

7. A method for etching a ferroelectric film according to claim 1, wherein the inert gas is Ar.

8. A method for etching a ferroelectric film made of a compound containing lead, comprising the steps of:

forming an insulating film, metal films, and a ferroelectric film on a substrate in this order;

forming an etching resistant film on the ferroelectric film, followed by patterning;

etching the ferroelectric film with a mixed gas containing an inert gas, a halogen type first gas, and a halogen type second gas containing carbon and hydrogen as an etching gas, using the patterned etching resistant film as an etching mask; and removing side-wall deposited films formed on side walls of the etched ferroelectric film by wet treatment with an aqueous solution.

9. A method for etching a ferroelectric film according to claim 8, wherein a substrate temperature in the course of the etching is in a range of 50° C. to 150° C.

10. A method for etching a ferroelectric film according to claim 8, wherein the etching resistant film is a resist.

11. A method for etching a ferroelectric film according to claim 8, wherein a ratio of a flow rate of the inert gas with respect to a total flow rate of the mixed gas is less than 50%.

12. A method for etching a ferroelectric film according to claim 8, wherein a vacuum degree in the course of etching using the mixed gas is in the range of 1 mTorr to 10 mTorr.

13. A method for etching a ferroelectric film according to claim 8, wherein the inert gas is Ar gas, the first gas of halogen type is $CF_4$ gas or $SF_6$ gas, and the second gas of halogen type is $CHF_3$ gas.

14. A method for etching a ferroelectric film according to claim 13, wherein a ratio of a flow rate of the second gas of halogen type with respect to a total flow rate of the first and second gas of halogen type is less than 70%.

15. A method for etching a ferroelectric film according to claim 8, wherein the aqueous solution used for the wet treatment is $H_2O$.

16. A method for etching a ferroelectric film according to claim 15, wherein a temperature of the aqueous solution used for the wet treatment is in the range of 25° C. to 100° C.

17. A method for etching a ferroelectric film according to claim 8, wherein the mixed gas further contains a hydrocarbon gas.

18. A method for etching a ferroelectric film according to claim 17, wherein the hydrocarbon gas is $CH_4$.

19. A method for etching a ferroelectric film made of a compound containing lead, comprising the steps of:

forming an insulating film, metal films, and a ferroelectric film on a substrate in this order;

forming an etching resistant film on the ferroelectric film, followed by patterning; and etching the ferroelectric film with a mixed gas containing an inert gas and a halogen gas or a halogenated gas as an etching gas, using the patterned etching resistant film as an etching mask, wherein the substrate temperature in the course of the etching is in the range of 100° C. to 400° C., and wherein a ratio of a flow rate of the halogen gas or the halogenated gas with respect to a total flow rate of the mixed gas is 50° or less.

20. A method for etching a ferroelectric film according to claim 19, wherein the etching resistant film is a silicon oxide film.

21. A method for etching a ferroelectric film according to claim 19, wherein the mixed gas further contains a hydrocarbon gas, and wherein a ratio of the flow rate of the hydrocarbon gas with respect to a total flow rate of the mixed gas is in the range of 2 to 10%.

22. A method for etching a ferroelectric film according to claim 19, wherein a ratio of a flow rate of the halogen gas or the halogenated gas with respect to a total flow rate of the mixed gas is 30 to 50%.

23. A method for etching a ferroelectric film according to claim 19, wherein the inert gas is Ar.

24. A method for etching a ferroelectric film according to claim 19, wherein the halogen gas or the halogenated gas is chlorine gas or a chloride gas.

* * * * *